United States Patent
Kim et al.

(10) Patent No.: US 8,023,835 B2
(45) Date of Patent: Sep. 20, 2011

(54) OPTICAL RECEIVER, OPTICAL AUDIO APPARATUS, OPTICAL COMMUNICATION APPARATUS AND OPTICAL RECEPTION METHOD

(75) Inventors: Gil Su Kim, Seoul (KR); Soo Won Kim, Seoul (KR)

(73) Assignee: Korea University Industry and Academy Cooperation Foundation, Seoul (KR)

( * ) Notice: Subject to any disclaimer, the term of this patent is extended or adjusted under 35 U.S.C. 154(b) by 896 days.

(21) Appl. No.: 11/956,272

(22) Filed: Dec. 13, 2007

(65) Prior Publication Data

US 2008/0205907 A1    Aug. 28, 2008

(30) Foreign Application Priority Data

Feb. 28, 2007    (KR) .................... 10-2007-0020625

(51) Int. Cl.
*H04B 10/06* (2006.01)
*H04B 10/02* (2006.01)
(52) U.S. Cl. .................... 398/208; 398/202
(58) Field of Classification Search ............ 398/202, 398/208, 135, 136, 138
See application file for complete search history.

(56) References Cited

U.S. PATENT DOCUMENTS

2002/0089728 A1*   7/2002   Kim .................. 359/189
2005/0265498 A1*   12/2005  Gunzelmann et al. ....... 375/350

* cited by examiner

*Primary Examiner* — Ken Vanderpuye
*Assistant Examiner* — Daniel Dobson
(74) *Attorney, Agent, or Firm* — Christie, Parker & Hale, LLP

(57) ABSTRACT

An optical receiver with a threshold voltage convergence and audio apparatus and communication apparatus using the optical receiver are provided. The optical receiver of the present invention includes an optical detector for converting a received optical signal to a current signal; a transimpedance amplifier for converting the current signal to a voltage signal; a level shifter for converging the voltage signal to a threshold voltage by removing an offset of the voltage signal, the level shifter comprising a plurality of linear subtractors connected in series; a reference voltage generator for generating a reference voltage in proportion to a variation of the offset of the voltage signal; and a comparator for comparing the threshold voltage and the reference voltage and generating a digital signal of a logic level according to a comparison result. The optical receiver of the present invention can compensate the shortcomings of the automatic voltage gain control and automatic threshold control techniques and reduce system complexity, thereby minimizing pulse-width distortion with a compact and low power consumption design and reducing the manufacturing costs of high performance digital interfaces.

12 Claims, 8 Drawing Sheets

OPTICAL RECEIVER, OPTICAL AUDIO APPARATUS, OPTICAL COMMUNICATION APPARATUS AND OPTICAL RECEPTION METHOD

CROSS-REFERENCE TO RELATED APPLICATION

This application claims priority of Korean Patent Application Number 10-2007-0020625,filed on Feb. 28, 2007.

BACKGROUND OF THE INVENTION

1. Field of the Invention

The present invention relates to an optical receiver and, in particular, to an optical receiver with a threshold voltage convergence and audio apparatus and communication apparatus using the optical receiver.

2. Description of the Related Art

With the advance of ubiquitous communications, the home network system, which has been limited to sharing printer and Internet connections, is developed to the multimedia home network system internetworking various electric appliances such as TV, audio system, and video system in real time.

Such a home network system is implemented by connecting the electric appliances through one or more wired and wireless networks. The optical link is the most appropriate link for implementing IEEE 1394 network for home, media oriented system transport (MOST) network for automobiles, and office network since it is lighter than electric wire in weight while guaranteeing high data rate with low data loss.

In order to apply the optical link to mobile devices such as cellular phone and MP3 player, the light weight and thin profiles of their internal elements are the design focus together with low power consumption. Until now, however, most of the optical transmitters and receivers are fabricated through bipolar junction transistor (BJT) process such that the devices are large in size relative to when fabricated using complementary metal oxide semiconductor (CMOS) technique, resulting in relatively high power consumption. Also, such conventional optical transmitters and receivers do not satisfy the data rate requirement of high performance audio standards such as DVD-Audio (96 KHz, 24 bits multichannel) and SACD (2822.4 kHz, 1 bit, Multichannel).

Typically, digital audio devices and other industrial devices require optical receiver that can recover digital input signals in wide dynamic range as well as both DC (continuous 0 and 1) and AC data.

The CMOS optical receiver can be implemented with an Automatic Gain Control (AGC) or Automatic Threshold Control (ATC) according to the kinds of control signals. Typically, the AGC-based optical receiver requires high speed devices for securing stability and accuracy of feedback system and an offset removal technique that increase the manufacturing costs and system complexity.

Meanwhile, the ATC-based optical receiver can be implemented in low manufacturing cost with a feed-forward system using low speed devices relative to the AGC-based optical receiver. However, recent ATC technique adopts a DC offset removal method for generating an accurate threshold voltage and a reset circuit for adjusting the threshold voltage in accordance with varying received power, as in the AGC technique, resulting in increase of complexity.

FIG. 1 is a block diagram illustrating a configuration of a conventional CMOS optical receiver, which includes an optical detector, a transimpedance amplifier (TIA), an ATC circuit, and a comparator. The ATI converts the current signal generated by the optical detector into amplified voltage signal, and the ATC circuit generates a threshold voltage in proportion to the received power. The voltage signals generated by the respective TIA and ATC are provided to the comparator so as to be converted into a digital signal of a logic level.

The optical detector and TIA can generate various levels of current and voltage signals according to the length of the optical fiber and variation of the received power such that the recovering such signals with a fixed threshold voltage causes a pulse-width distortion, resulting in quality deterioration of digital audio signal. In order to overcome this problem, the ATC circuit detects two peak signals output from the TIA and outputs an average voltage of the two peak signals.

However, such ATC circuit generates DC-offset by the false settings of the peak detector and resisters. In order to compensate the DC-offset, an offset removal circuit is required. Also, the ATC circuit requires additional reset circuit for generating, when the received power varies, an accurate threshold voltage by discharging capacitor of the peak detector before the varied signal is input. These offset-removal and reset circuits increase the system complexity.

As described above, the conventional optical receiver is disadvantageous in system complexity and manufacturing cost with the requirement of the offset-removal and reset circuits.

SUMMARY OF THE INVENTION

The present invention has been made in an effort to solve the above problems, and it is an object of the present invention to provide an optical receiver capable of minimizing a pulse-width distortion and reducing system complexity and power consumption using a threshold voltage convergence, while overcoming the shortcomings of the AGC and ATC techniques.

It is another object of the present invention to provide an optical audio apparatus employing an optical receiver that is capable of converging a threshold voltage to within a predetermined range.

It is another object of the present invention to provide an optical communication apparatus employing an optical receiver that is capable of converging a threshold voltage to within a predetermined range.

In accordance with an aspect of the present invention, the above and other objects are accomplished by an optical receiver. The optical receiver includes an optical detector for converting a received optical signal to a current signal; a transimpedance amplifier for converting the current signal to a voltage signal; a level shifter for converging the voltage signal to a threshold voltage by removing an offset of the voltage signal, the level shifter comprising a plurality of linear subtractors connected in series; a reference voltage generator for generating a reference voltage in proportion to a variation of the offset of the voltage signal; and a comparator for comparing the threshold voltage and the reference voltage and generating a digital signal of a logic level according to a comparison result.

In accordance with another aspect of the present invention, the above and other objects are accomplished by an optical audio apparatus. The optical audio apparatus includes an optical detector for converting a received optical signal to a current signal; a transimpedance amplifier for converting the current signal to a voltage signal; a level shifter including a plurality of linear subtractors connected in series for converging the voltage signal to a threshold voltage by removing an offset of the voltage signal; a reference voltage generator for generating a reference voltage in proportion to a variation of the offset of the voltage signal; a comparator for comparing the threshold voltage and the reference voltage and generating a digital signal of a logic level according to a comparison result; and a signal processor for processing the digital signal of the logic level to be output as an audio signal.

In accordance with another aspect of the present invention, the above and other objects are accomplished by an optical communication apparatus. The optical communication apparatus includes a transimpedance amplifier for converting the current signal to a voltage signal; a level shifter including a plurality of linear subtractors connected in series for converging the voltage signal to a threshold voltage by removing an offset of the voltage signal; a reference voltage generator for generating a reference voltage in proportion to a variation of the offset of the voltage signal; a comparator for comparing the threshold voltage and the reference voltage and generating a digital signal of a logic level according to a comparison result; and a data recoverer for recovering original data from the digital signal of the logic level.

In accordance with another aspect of the present invention, the above and other objects are accomplished by an optical reception method. The optical reception method includes converting a received optical signal to a current signal; converting the current signal to a voltage signal; converging the voltage signal to a threshold voltage by removing an offset of the voltage signal using a plurality of linear subtractors connected in series; and generating a digital signal of a logic level on the basis of a value obtained by comparing the threshold voltage and the reference voltage.

BRIEF DESCRIPTION OF THE DRAWINGS

The above and other objects, features and advantages of the present invention will be more apparent from the following detailed description in conjunction with the accompanying drawings, in which.

DETAILED DESCRIPTION OF EXEMPLARY EMBODIMENTS

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Figure 1:
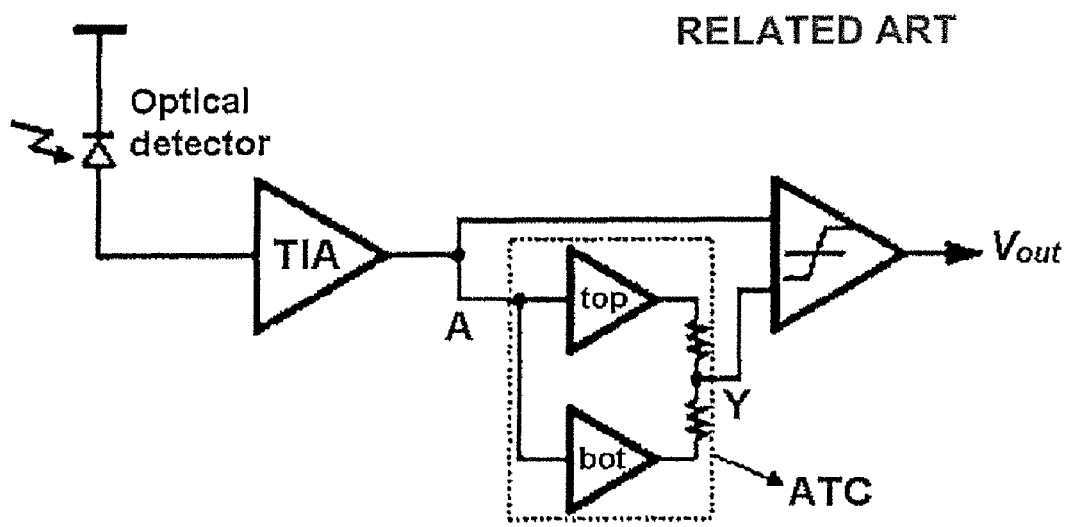
FIG. 1 is a block diagram illustrating a configuration of a conventional CMOS optical receiver.
Figure 2:
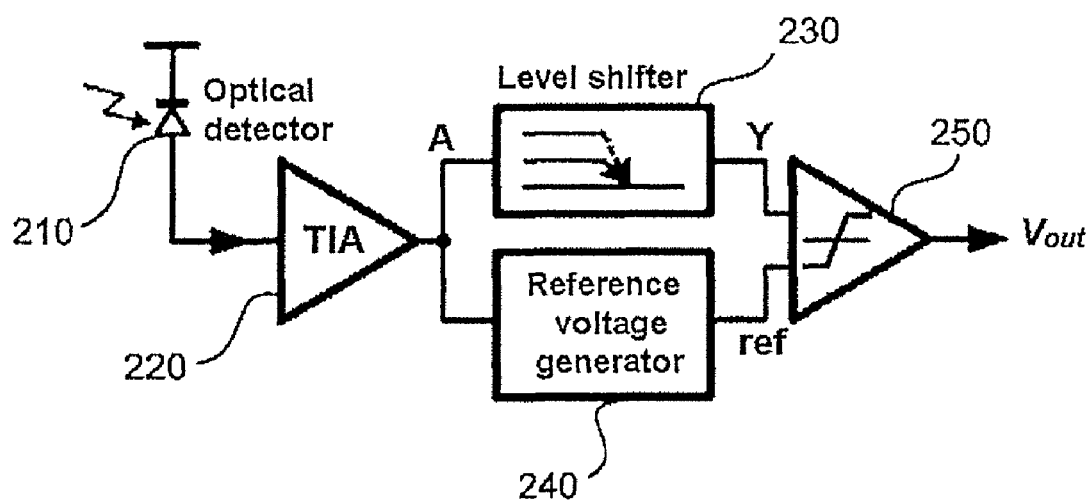
FIG. 2 is a block diagram illustrating a configuration of an optical receiver according to an exemplary embodiment of the present invention.

FIG. 2 is a block diagram illustrating a configuration of an optical receiver according to an exemplary embodiment of the present invention.

In FIG. 2, the optical receiver is a CMOS optical device including an optical detector 210, a TIA 220, a level shifter 230, a reference voltage generator 240, and a comparator 250.

Unlike the conventional optical receiver in which an ATC generates different levels of threshold voltage, the optical receiver of the present invention converges the voltages to a single threshold voltage by means of the level shifter 230 and the reference voltage generator 240. The threshold voltage convergence technique of the present invention is implemented without an AC coupling capacitor for blocking DC components characterized in the AC coupling technique, thereby securing space. In such a manner, the optical receiver of the present invention can have the advantages of both the AC-coupling and DC-coupling.

The optical detector 210 detects an optical signal and converts the optical signal to an electrical signal (current signal).

The TIA 220 converts the current signal output by the optical detector 210 to a voltage signal.

The level shifter 230 is composed of a plurality of linear subtractors connected in series for removing an offset of the voltage signal output by the TIA 220 and converges the voltage signal to the threshold voltage. At this time, the level shifter 230 converges a high level and a low level of the voltage signal to an average so as to nullify the difference of the average voltages.

The reference voltage generator 240 generates a reference voltage in proportion to the offset variation of the voltage signal output by the TIA 220.

The comparator 250 compares the output voltage of the level shifter 230 and the reference voltage output by the reference voltage generator 240 and generates a digital signal of a logic level according to the comparison result.

Figure 3:
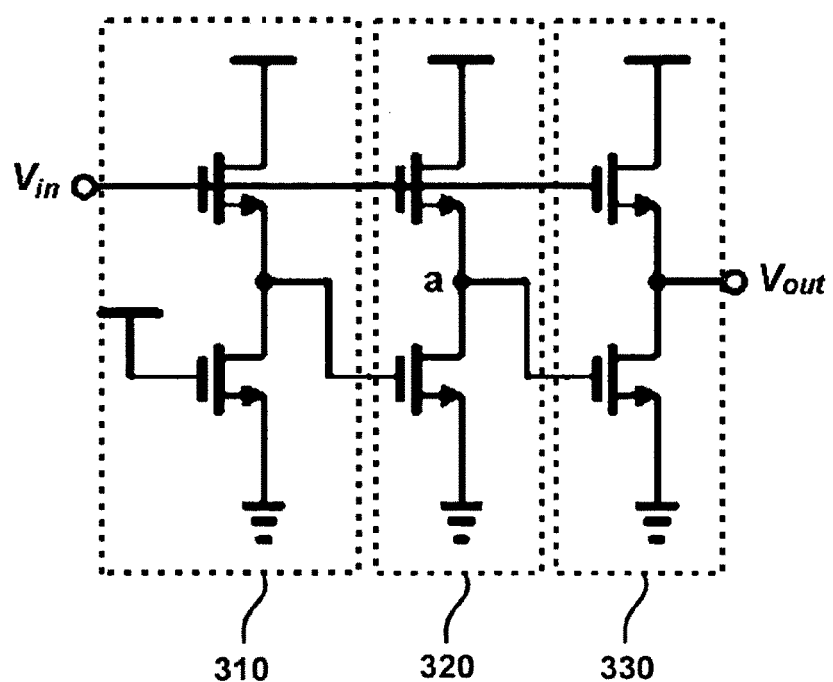
FIG. 3 is a circuit diagram illustrating a configuration of the level shifter of FIG. 2.

FIG. 3 is a circuit diagram illustrating a configuration of the level shifter of FIG. 2.

As shown in FIG. 3, the level shifter 230 is composed of three-stage linear subtractors for extracting a signal having another level of threshold voltage in proportion to the threshold voltage of the input signal and outputting a difference value between the input signal and the extracted signal.

The first linear subtractor 310 operates as a role of region keeper such that the second stage operates in a subthreshold region.

The second stage part including a node "a" having a high parasitic resistance needs a high resistance component for maintaining the DC voltage detected in a wide frequency band. In a case that the received power of the optical receiver varies, however, the response time may be lengthened such that the parasitic resistance should be set with an appropriated value. For this purpose, the output node of the first stage is connected to a transistor of the second stage such that the transistor operates in the subthreshold region, whereby the level shifter 230 can operate with quick response time. The TIA 220 is implemented with a common gate amplifier for reducing the influence by parasitic capacitance at the input node.

The signal extraction is performed using the parasitic resistance-capacitance circuit of the input transistor at the second stage. The second linear subtractor 320 of the second stage supplies another threshold voltage which is in proportion to the threshold voltage of the input signal to the next stage. The voltage averaging at node "a" equalizes difference of the extracted threshold voltage to the difference of the threshold voltages of the input signals.

The third subtractor 330 at the third stage performs subtraction on the signal detected at node "a" and the input signal so as to generate a signal having a converged threshold voltage.

Figure 4:
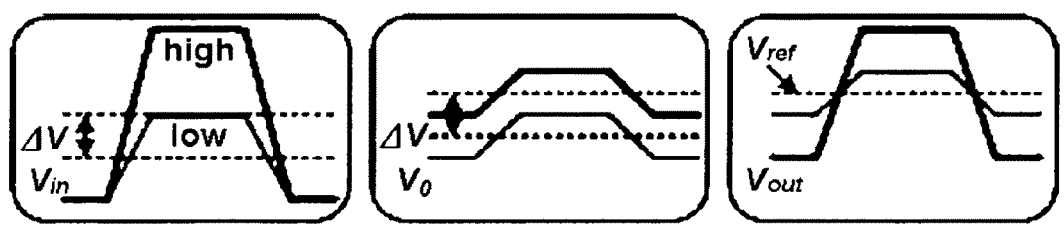
FIG. 4 shows graphs illustrating waveforms generated at each stages of the level shifter of FIG. 3.

FIG. 4 shows graphs illustrating waveforms generated at each stages of the level shifter of FIG. 3.

From left, a waveform of the input signal of the level shifter, a waveform of the output signal of the second linear subtractor 320, and a waveform of the output signal of the third subtractor 330.

As shown in the first graph, the high and low level signals are converged to an average level such that the average voltage difference ΔV becomes 0. In order to recover this wave form, a reference voltage is required.

Figure 5:
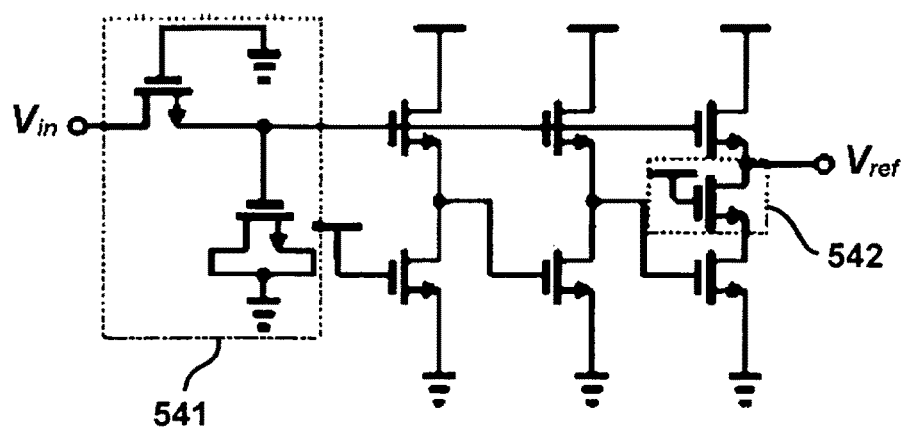
FIG. 5 is a circuit diagram illustrating a configuration of the reference voltage generator of FIG. 2.

FIG. 5 is a circuit diagram illustrating a configuration of the reference voltage generator of FIG. 2. FIG. 5 shows a duplicate bias circuit designed as a reference voltage generator.

In order for the comparator 250 to generate a digital signal without pulse-width distortion, a reference voltage identical with the threshold voltage is converged at the level shift 230. For this purpose, it is required to design a duplicate bias circuit capable of generating an output varied in proportion to the offset change of the input signal. The duplicate bias circuit includes a low pass filter 541 for detecting a minimum peak voltage of the input signal at the first stage and a transistor 542 for compensating the offset in the real circuit at the last stage.

The offset compensation transistor 542 is driven by a load at a node connecting the drain and source thereof between two transistors of the linear subtractors.

Figure 6:
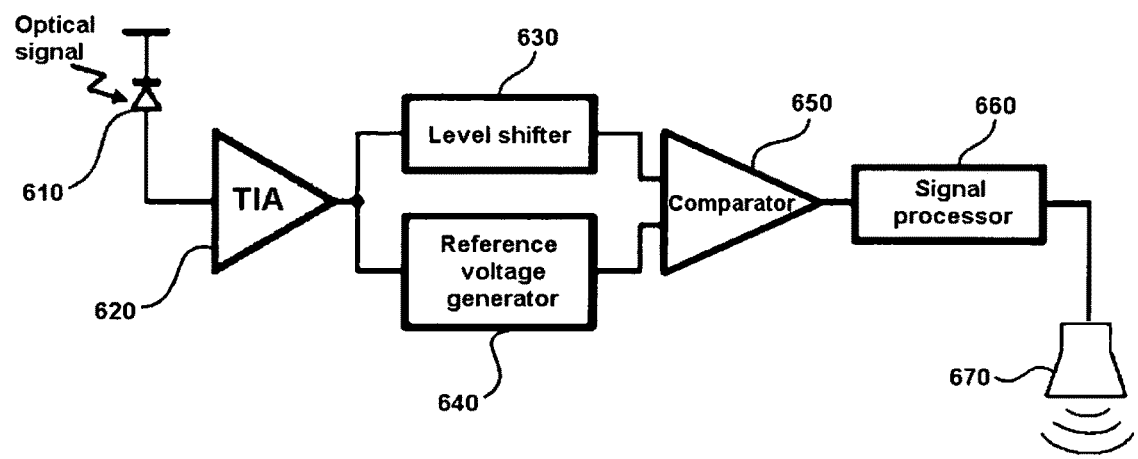
FIG. 6 is a block diagram illustrating a configuration of an optical audio apparatus employing the optical receiver of FIG. 2

FIG. 6 is a block diagram illustrating a configuration of an optical audio apparatus employing the optical receiver of FIG. 2.

In FIG. 6, an optical detector 610 detects an optical signal and converts it to an electric current signal. At this time, the optical signal can be transmitted to a controller of a multichannel speaker system connected to a digital TV, DVD player, or a CD player.

A TIA 620 converts the current signal to a corresponding voltage signal.

A level shifter 630 is composed of a plurality of subtractors connected in series and converges the voltage signal to the threshold voltage by removing the offset of the voltage signal output by the TIA 620.

A reference voltage generator 640 generates a reference voltage in proportion to the offset variation of the voltage signal output by the TIA 620.

A comparator 650 compares the output voltage of the level shifter 630 and the reference voltage output by the reference voltage generator 640 and generates a digital signal of a logic level according to the comparison result.

A signal processor 660 generates data according to the logic level of the comparator 650 and performs an audio signal processing on the data so as to output an audio signal.

At this time, the audio signal can be coded and decoded by an audio codec. Also, the audio signal can be filtered for adding a sound field effect.

Figure 7:
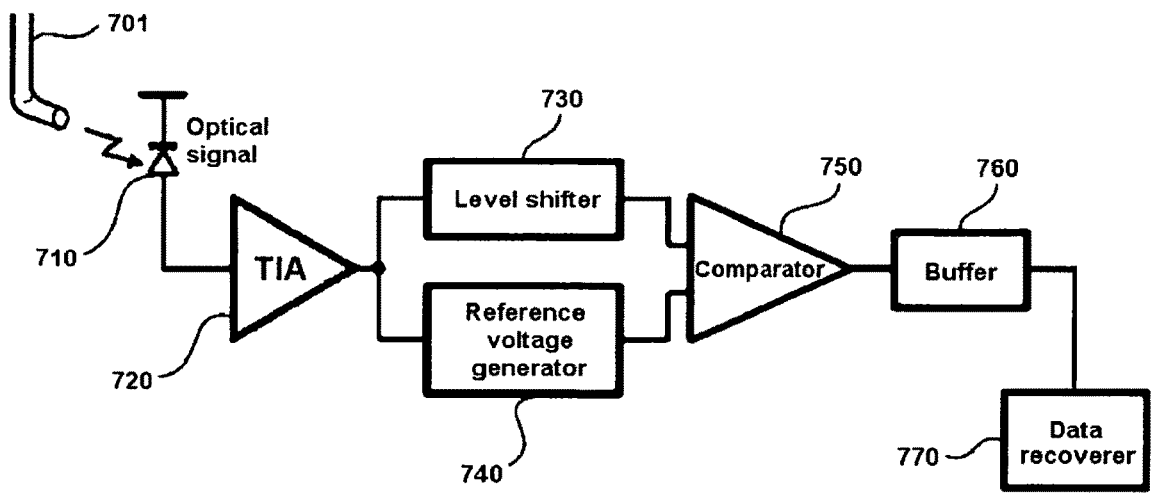
FIG. 7 is a block diagram illustrating a communication apparatus employing the optical receiver of FIG. 2.

FIG. 7 is a block diagram illustrating a communication apparatus employing the optical receiver of FIG. 2.

In FIG. 7, an optical detector 710 converts a received optical signal to an electric current signal. Here, the optical signal may be received through an optical fiber 701.

A TIA 720 converts the current signal to a voltage signal.

A level shifter 730 is composed of a plurality of linear subtractors connected in series and converges the voltage signal to the threshold voltage by removing the offset of the voltage signal output by the TIA 720.

A reference voltage generator 740 generates a reference voltage in proportion to the offset variation of the voltage signal output by the TIA 720.

A comparator 750 compares the output voltage of the level shifter 730 and the reference voltage output by the reference voltage generator 740 and generates a digital signal of a logic level according to the comparison result.

A buffer 760 queues data of the logic level determined by the comparator 750.

A data recoverer 770 recovers original data transmitted by a transmission part from the data read out from the buffer 760.

Figure 8A:
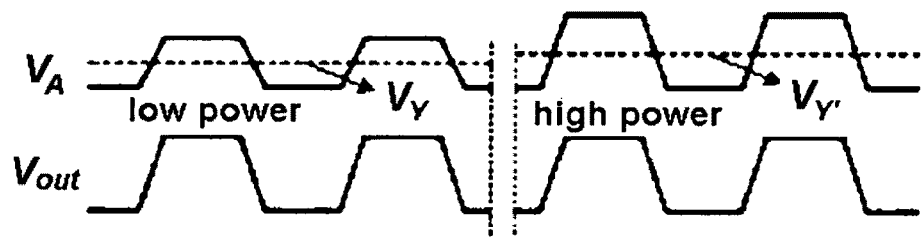
FIGS. 8a and 8b are graphs illustrating waveforms of output signals of a conventional optical receiver and an optical receiver according to an embodiment of the present invention.
Figure 8B:
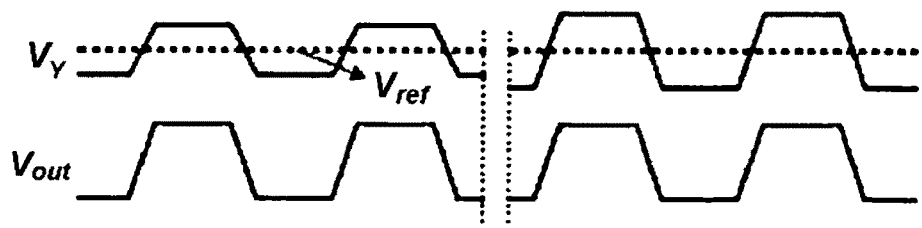

FIGS. 8a and 8b are graphs illustrating waveforms of output signals of a conventional optical receiver and an optical receiver according to an embodiment of the present invention.

In the conventional optical receiver, the threshold voltage changes according to the variation of the received power, thereby causing a pulse-width distortion. Although the pulse-width distortion can be prevented by adding compensation means, this increases hardware complexity and requires redundant installation space. Meanwhile, the optical receiver of the present invention adopts a level shifter for converging the input voltage to a predetermined threshold voltage regardless of variation of the received signal power, resulting in minimizing the pulse-width distortion while maintaining small chip size.

The optical receiver fabricated as a working sample according to an embodiment of the present invention occupies 410*140 μm$^2$ of an active area which is ¹⁄₁₆ of that of the conventional ATC-based CMOS optical receiver.

Figure 9:
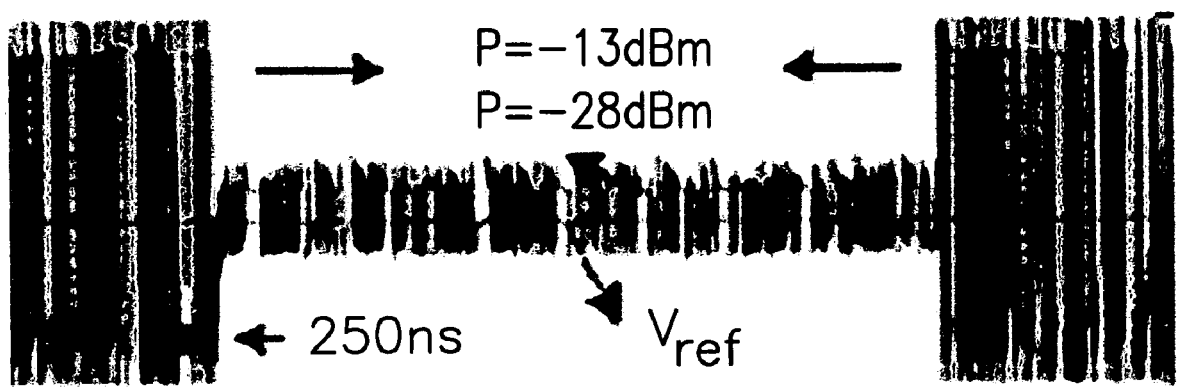
FIG. 9 is a graph illustrating a simulation result of an excessive response characteristic test of the level shifter of FIG. 3.

FIG. 9 is a graph illustrating a simulation result of an excessive response characteristic test of the level shifter of FIG. 3.

The simulation result of FIG. 9 shows that the level shifter according to an embodiment of the present invention operates with a quick response time while receiving a signal having a maximum power of −13 dBm and a minimum power of −28 dBm alternately.

Figure 10:
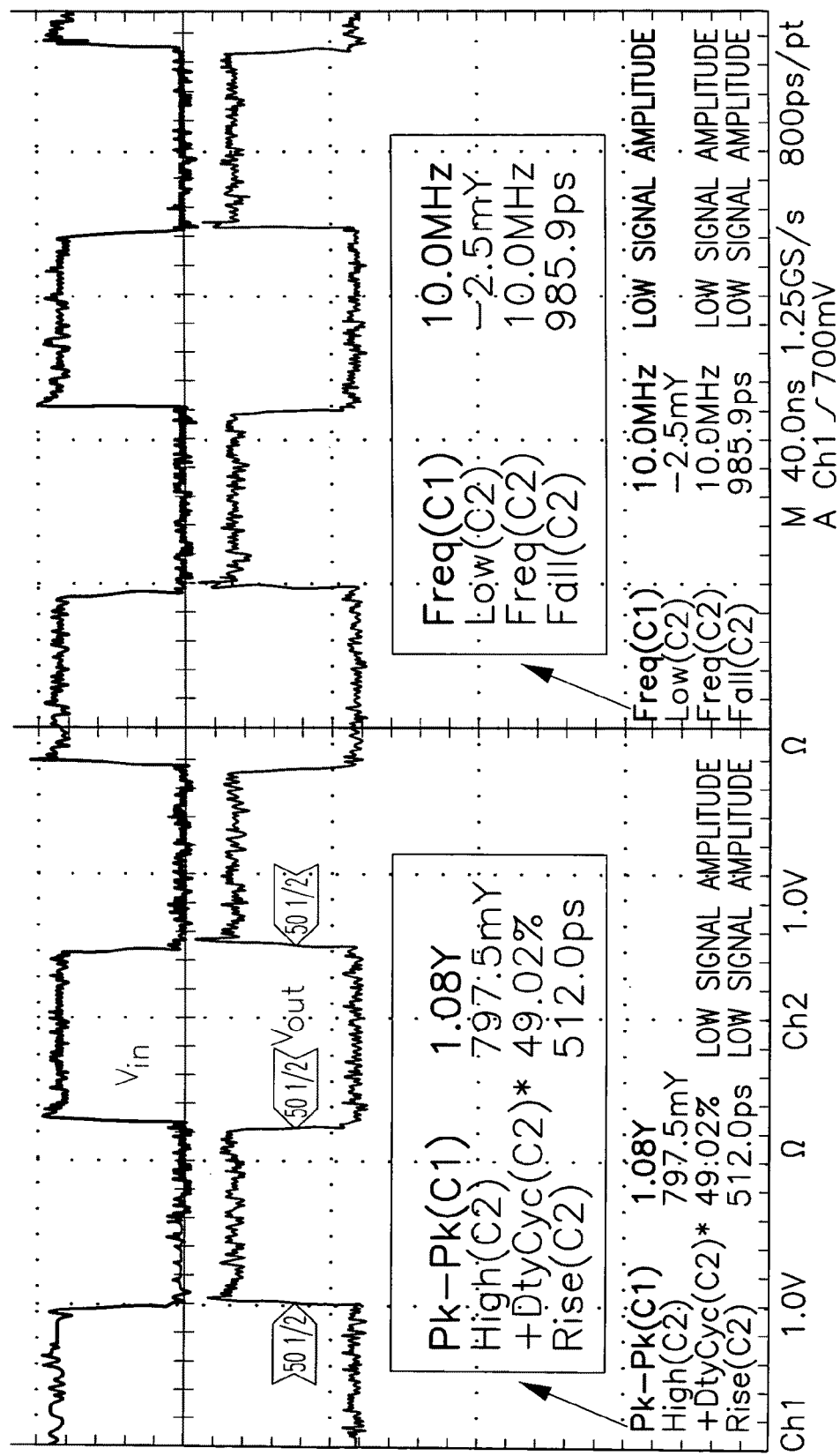
FIG. 10 is a graph illustrating a simulation result of an excessive response characteristic test of the optical receiver of FIG. 2.

FIG. 10 is a graph illustrating a simulation result of an excessive response characteristic test of the optical receiver of FIG. 2. FIG. 10 shows a pulse-width distortion measured when the data signals are applied at 20 Mbps. In the simulation result of FIG. 10, the optical receiver of the present invention shows quick heightening and lowering times relative to the conventional optical receiver using the conventional dual output TIA. This is because of the TIA having a small parasitic capacitance at the input node.

Figure 11:
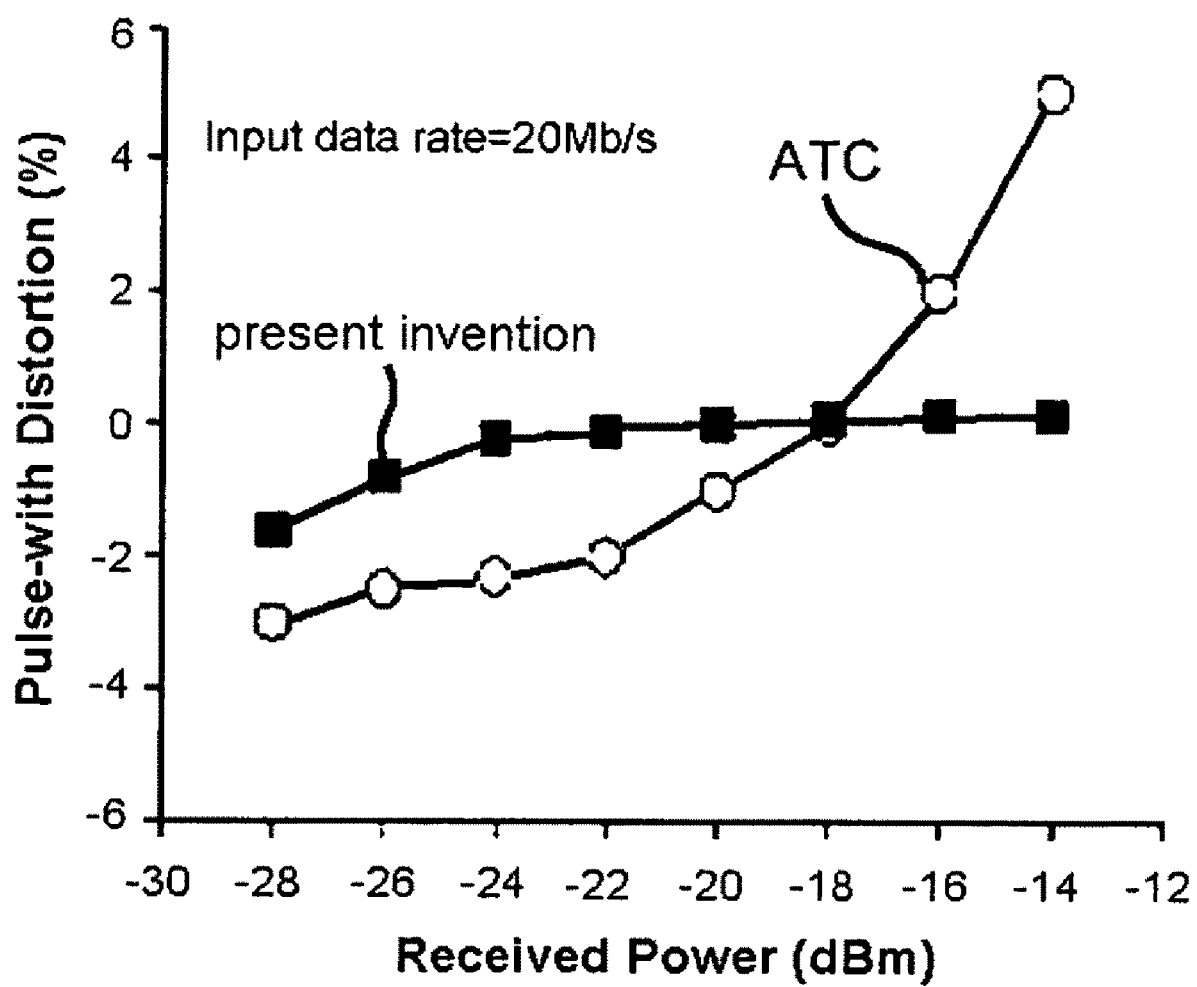
FIG. 11 is a graph illustrating simulation results of pulse-width distortion analysis on the conventional optical receiver and the optical receiver according to an embodiment of the present invention.

FIG. 11 is a graph illustrating simulation results of pulse-width distortion analysis on the conventional optical receiver and the optical receiver according to an embodiment of the present invention. The pulse-width distortions are measured at the input data rate of 20 Mbps while changing the received power in the range between −28 dBm and −13 dBm. As shown in FIG. 11, the optical receiver of the present invention shows the pulse-width distortion of about 2% relatively lower than that of the conventional ATC optical receiver. Also, a maximum power consumption of the optical receiver according to the present invention is measured as 9 mW.

Preferably, the optical detector includes a photodiode generating current signal according to the flow of the carriers having absorbed photon energy of the optical signal.

Preferably, the photodiode includes a PN diode.

Preferably, the photodiode includes a PIN diode.

Preferably, the photodiode includes a metal semiconductor metal diode.

Figure 12:
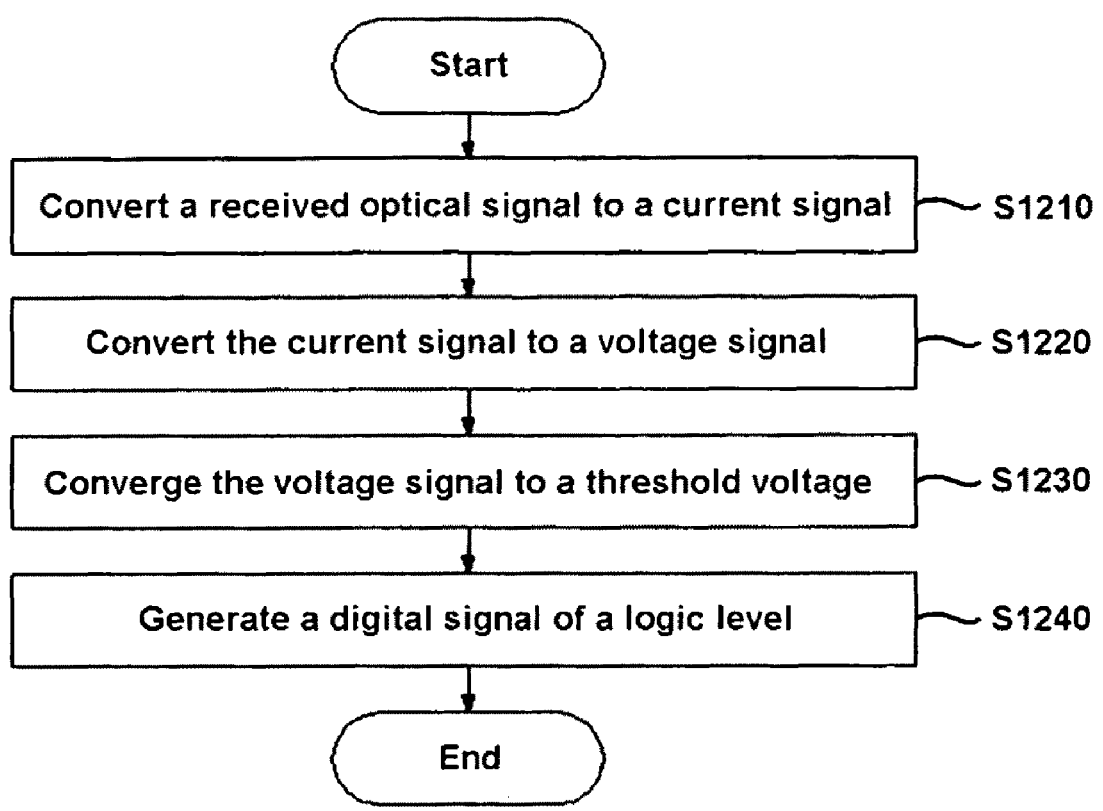
FIG. 12 is a flowchart illustrating an optical reception method according to an exemplary embodiment of the present invention.

FIG. 12 is a flowchart illustrating an optical reception method according to an exemplary embodiment of the present invention.

First, a received optical signal is converted to a current signal (S1210).

Next, the current signal is converted to a voltage signal (S1220).

Next, the voltage signal is converged to a threshold voltage by removing an offset of the voltage signal using a plurality of linear subtractors connected in series (S1230).

After the voltage signal is converged to a threshold voltage, a digital signal of a logic level is generated on the basis of a value obtained by comparing the threshold voltage and the reference voltage (S1240).

Although exemplary embodiments of the present invention have been described in detail hereinabove, it should be clearly understood that many variations and/or modifications of the basic inventive concepts taught herein which may appear to those skilled in the present art will still fall within the spirit and scope of the present invention, as defined in the appended claims.

As described above, the optical receiver of the present invention can compensate the shortcomings of the automatic voltage gain control and automatic threshold control techniques and reduce system complexity, thereby minimizing pulse-width distortion with a compact and low power consumption design and reducing the manufacturing costs of high performance digital interfaces.

For these reasons, the optical receiver of the present invention can be adopted for high performance digital audio devices and digital communication devices using fiber optics with the high data reliability and price competiveness.

What is claimed is:

1. An optical receiver comprising:
   an optical detector for converting a received optical signal to a current signal;
   a transimpedance amplifier for converting the current signal to a voltage signal;
   a level shifter for converging the voltage signal to a threshold voltage by removing an offset of the voltage signal, the level shifter comprising a plurality of linear subtractors connected in series;
   a reference voltage generator for generating a reference voltage in proportion to a variation of the offset of the voltage signal; and
   a comparator for comparing the threshold voltage and the reference voltage and generating a digital signal of a logic level according to a comparison result.

2. The optical receiver of claim 1, wherein the level shifter comprises:
   a first linear subtractor for allowing the level shifter to operate in a subthreshold region;
   a second linear subtractor for equalizing a difference between threshold voltages proportional to the threshold voltage of the voltage signal to a difference between threshold voltages of the voltage signal; and
   a third linear subtractor for outputting a voltage signal having the threshold voltage converged by subtracting the threshold voltage from the voltage signal.

3. The optical receiver of claim 1, wherein the level shifter converges high and low levels of the voltage signal and modifies average voltage differences to 0.

4. The optical receiver of claim 1, wherein the reference voltage generator comprises:
   a low pass filter for detecting minimum peak voltage of the voltage signal;
   a plurality of linear subtractors connected in series for generating a reference voltage by inputting an output of the low pass filter; and
   an offset compensation transistor connected to output nodes of the plurality of subtractors for compensating the offset of the reference voltage.

5. The optical receiver of claim 4, wherein the offset compensation transistor of which drain and source are connected to two transistors of the linear subtractor of output end, is driven by a load.

6. The optical receiver of claim 1, wherein the transimpedance amplifier is implemented with a common gate amplifier.

7. An optical audio apparatus comprising:
   an optical detector for converting a received optical signal to a current signal;
   a transimpedance amplifier for converting the current signal to a voltage signal;
   a level shifter including a plurality of linear subtractors connected in series for converging the voltage signal to a threshold voltage by removing an offset of the voltage signal;
   a reference voltage generator for generating a reference voltage in proportion to a variation of the offset of the voltage signal;
   a comparator for comparing the threshold voltage and the reference voltage and generating a digital signal of a logic level according to a comparison result; and
   a signal processor for processing the digital signal of the logic level to be output as an audio signal.

8. The optical audio apparatus of claim 7, wherein the level shifter comprises:
   a first linear subtractor for allowing the level shifter to operate in a subthreshold region;
   a second linear subtractor for equalizing a difference between threshold voltages proportional to the threshold voltage of the voltage signal to a difference between threshold voltages of the voltage signal; and
   a third linear subtractor for outputting a voltage signal having the threshold voltage converged by subtracting the threshold voltage from the voltage signal.

9. The optical audio apparatus of claim 7, wherein the level shifter converges high and low levels of the voltage signal and modifies average voltage differences to 0.

10. The optical audio apparatus of claim 7, wherein the reference voltage generator comprises:
    a low pass filter for detecting minimum peak voltage of the voltage signal;
    a plurality of linear subtractors connected in series for generating a reference voltage by inputting an output of the low pass filter; and
    an offset compensation transistor connected to output nodes of the plurality of subtractors for compensating the offset of the reference voltage.

11. An optical communication apparatus comprising:
    an optical detector for converting a received optical signal to a current signal;

a transimpedance amplifier for converting the current signal to a voltage signal;
a level shifter including a plurality of linear subtractors connected in series for converging the voltage signal to a threshold voltage by removing an offset of the voltage signal;
a reference voltage generator for generating a reference voltage in proportion to a variation of the offset of the voltage signal;
a comparator for comparing the threshold voltage and the reference voltage and generating a digital signal of a logic level according to a comparison result; and
a data recoverer for recovering original data from the digital signal of the logic level.

12. An optical reception method comprising:
converting a received optical signal to a current signal;
converting the current signal to a voltage signal;
generating a reference voltage in proportion to a variation of an offset of the voltage signal;
converging the voltage signal to a threshold voltage by removing the offset of the voltage signal using a plurality of linear subtractors connected in series; and
generating a digital signal of a logic level on the basis of a value obtained by comparing the threshold voltage and the reference voltage.

* * * * *